(12) United States Patent
Valliappan et al.

(10) Patent No.: US 8,136,013 B2
(45) Date of Patent: Mar. 13, 2012

(54) BURST ERROR CORRECTION BASED ON FIRE CODE

(75) Inventors: Magesh Valliappan, Austin, TX (US); Velu Pillai, Austin, TX (US)

(73) Assignee: Broadcom Corporation, Irvine, CA (US)

( * ) Notice: Subject to any disclaimer, the term of this patent is extended or adjusted under 35 U.S.C. 154(b) by 1137 days.

(21) Appl. No.: 11/840,442

(22) Filed: Aug. 17, 2007

(65) Prior Publication Data

US 2008/0052597 A1 Feb. 28, 2008

Related U.S. Application Data

(60) Provisional application No. 60/840,123, filed on Aug. 25, 2006.

(51) Int. Cl.
*H03M 13/00* (2006.01)
(52) U.S. Cl. ............ 714/762; 714/758; 714/785
(58) Field of Classification Search ............ 714/762, 714/761, 746, 758, 781, 785
See application file for complete search history.

(56) References Cited

U.S. PATENT DOCUMENTS

| | | | |
|---|---|---|---|
| 3,648,238 A * | 3/1972 | Yarrington | 714/762 |
| 3,676,851 A | 7/1972 | Eastman | |
| 4,201,976 A | 5/1980 | Patel | |
| 4,951,284 A * | 8/1990 | Abdel-Ghaffar et al. | 714/761 |
| 5,381,423 A | 1/1995 | Turco | |
| 5,491,701 A | 2/1996 | Zook | |
| 5,691,994 A * | 11/1997 | Acosta et al. | 714/784 |
| 5,936,978 A | 8/1999 | Ramesh | |
| 6,754,871 B1 | 6/2004 | Pines et al. | |
| 7,231,579 B1 * | 6/2007 | Pines et al. | 714/762 |
| 2008/0082896 A1 | 4/2008 | Valliappan et al. | |

OTHER PUBLICATIONS

"10G-Base-KR FEC Tutorial", IEEE 802 Plenary, pp. 1-87, Jul. 2006.
Office Action received for U.S. Appl. No. 11/840,720, mailed on Apr. 29, 2011, 12 pages.

* cited by examiner

*Primary Examiner* — Fritz Alphonse
(74) *Attorney, Agent, or Firm* — Brake Hughes Bellermann LLP

(57) ABSTRACT

According to an example embodiment, an apparatus may include logic. The apparatus may be configured to: determine, based on an error location polynomial, an error location syndrome corresponding to an actual location of a burst error in a data block; select a burst error pattern that is less than or equal to M bits, and having no more than Y consecutive zeros within the burst error, where M is greater than the order of the error location polynomial; determine an error pattern syndrome based on the selected burst error pattern and the error location polynomial; and determine an actual location of the burst error in the data block based on the error location syndrome and the error pattern syndrome.

18 Claims, 9 Drawing Sheets

US 8,136,013 B2

BURST ERROR CORRECTION BASED ON FIRE CODE

CROSS-REFERENCE TO RELATED APPLICATIONS

This application claims priority under 35 U.S.C. §119 to provisional patent application 60/840,123, filed Aug. 25, 2006, titled "DIGITAL ELECTRONIC DISPERSION COMPENSATION FOR MULTI-MODE FIBER," which is incorporated herein by reference in its entirety.

BACKGROUND

Cyclic Redundancy check (CRC) is a technique that is commonly used by communication systems to allow for detection and correction of some data errors.

Forward Error Correction (FEC) is a system of error control for data transmission where a sender may add redundant information to a message. This may allow a receiver to detect and correct errors without the need to ask the sender to resend the message, at least for some cases. Different types of coding techniques may be used, such as Block codes, convolutional codes or other codes.

A particular class of cyclic codes, known as Fire codes, are sometimes used to correct burst errors in communication systems. Burst errors may include a sequence of error symbols or error bits. However, improved techniques for burst error correction are desirable.

SUMMARY

Various embodiments are disclosed relating to receivers, and also relating to correcting burst errors based on Fire codes.

According to an example embodiment, a method may include determining, based on an error location polynomial, an error location syndrome corresponding to an actual location of a burst error in a data block; determining a first error pattern syndrome of the burst error based on an error pattern polynomial; selecting, based on the first error pattern syndrome, a burst error pattern that matches one of a plurality of classes of correctable errors; determining a second error pattern syndrome based on the selected burst error pattern and the error location polynomial; and, determining an actual location of the burst error in the data block based on the error location syndrome and the second error pattern syndrome.

According to another example embodiment, an apparatus may include logic. The apparatus may be configured to: determine, based on an error location polynomial, an error location syndrome corresponding to an actual location of a burst error in a data block; select a burst error pattern that matches one of a plurality of classes of correctable errors; determine an error pattern syndrome based on the selected burst error pattern and the error location polynomial; and determine an actual location of the burst error in the data block based on the error location syndrome and the error pattern syndrome.

In another example embodiment, a method may include determining an error location syndrome, determining an error pattern syndrome, rotating the error pattern syndrome until a correctable burst error pattern is found that matches one of a plurality of classes of correctable errors, including: 1) a burst error of length that is less than or equal to an order of an error location polynomial; or 2) a burst error of length that is less than or equal to M bits, and having no more than Y consecutive zeros within the burst error, where M is greater than the order of the error location polynomial; and determining an actual location of a burst error in a data block based on the error location syndrome and the correctable burst error pattern.

In another example embodiment, a method may include determining an actual location (e.g., N) of a burst error in a data block, selecting a burst error pattern that is a correctable error based on adjusting an error pattern syndrome by an adjustment amount (e.g., S), determining a correction vector based on the burst error pattern, shifting the correction vector by an offset amount based on (N) and (S), and correcting the burst error in the data block based on the shifted correction vector.

In another example embodiment, a method may include determining, based on an error location polynomial, an error location syndrome corresponding to an actual location (e.g., N) of a burst error in a data block; determining an error pattern syndrome of a burst error based on a CRC error and an error pattern polynomial; rotating the error pattern syndrome S number of bits until a correctable burst error pattern is found; determining an actual location of the burst error in the data block based on the error location syndrome and the correctable burst error pattern; determining which of a plurality of sub-blocks the burst error is located within a data block based on the actual location of the burst error and the number of bits that the error pattern syndrome is rotated; determining a correction vector by: shifting the burst error pattern by an offset amount based on the sub-block where the burst error is located; and, further shifting the shifted burst error pattern an amount based on the actual location (N) of the burst error in the data block; And, applying the correction vector to the data block to correct the burst error.

In another example embodiment, a method may include rotating or shifting an error pattern syndrome an amount until a correctable burst error pattern is found; determining an actual location (N) of the burst error in the data block; determining which of a plurality of sub-blocks the burst error is located within a data block based on the actual location (N) of the burst error and the amount (S) that the error pattern syndrome is rotated; determining an offset amount based on (N) and (S), the offset amount being associated with which sub-block the burst error is located in the data block; determining a correction vector by shifting the burst error pattern an amount (N) and by the offset amount; and, applying the correction vector to the data block to correct the burst error.

DETAILED DESCRIPTION

Figure 1:
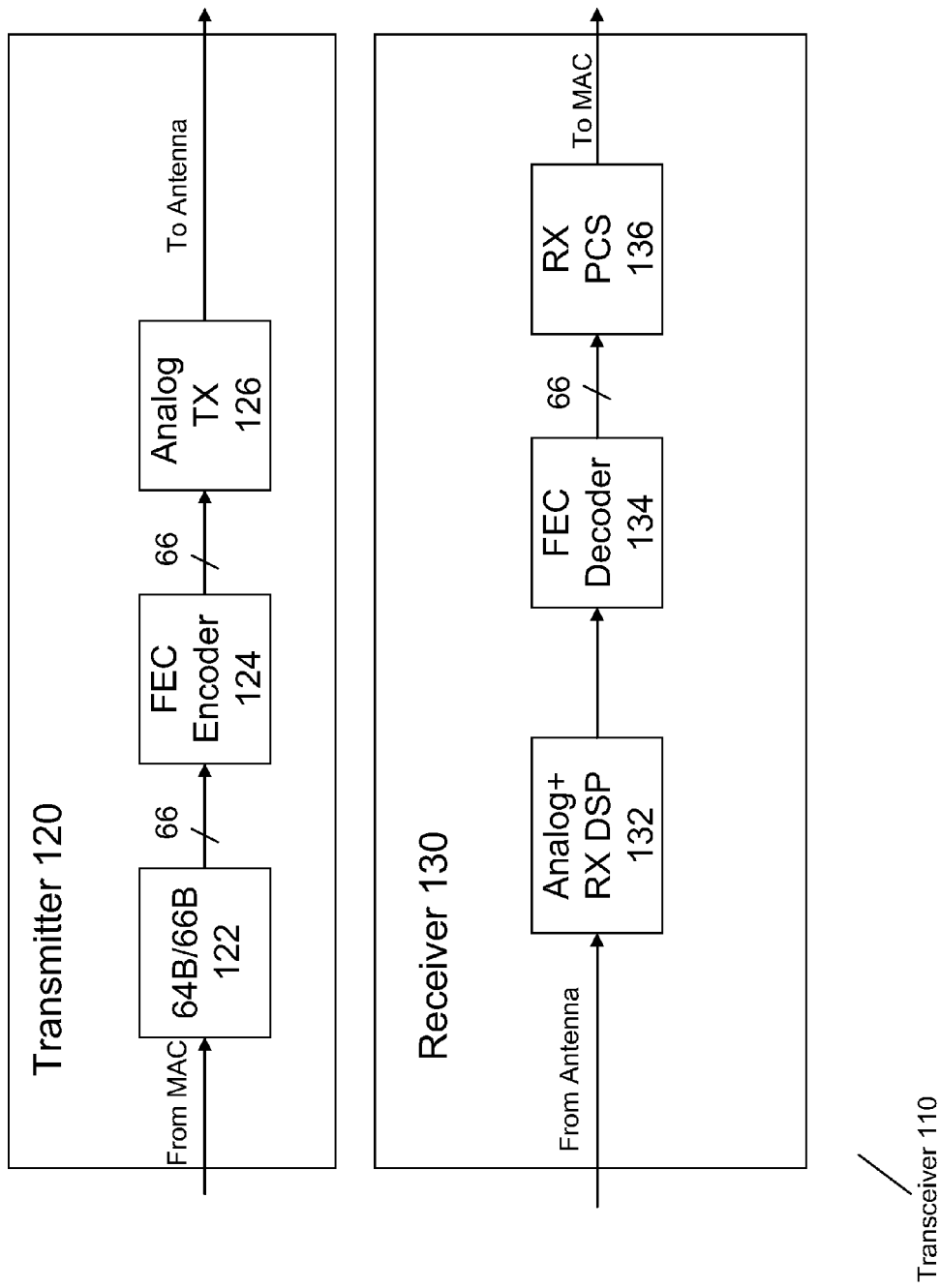
FIG. 1 is a block diagram of a wireline transceiver according to an example embodiment.

FIG. 1 is a block diagram of a transceiver according to an example embodiment. Transceiver 110 may include a transmitter 120 and a receiver 130. Only some of the blocks of transmitter 120 and receiver 130 are shown in FIG. 1. Transmitter 120 and/or receiver 130 may include other blocks not shown. Transceiver 110 may be provided in any type of network node or device, such as a wired device, a wireless device, etc. For example, transceiver 110 may be provided for communication across an electrical backplane, for communication across an optical channel, for communication across another type of wire channel or a wireless channel. For example, transceiver 110 may be provided within a network device to communicate with other network devices across an electrical or optical backplane.

64B/66B physical coding sublayer (PCS) 122 may receive bits or packets from a MAC (media access control) layer or other layer. For example, PCS 122 may receive 64 bit words, and may add two synchronization bits, including a transmit enable bit and a transmit error bit to convert the 64 bit words to 66 bit code words.

FEC (forward error correction) encoder 124 may, for example, convert 66 bit code words into 65 bit code words by converting the two synchronization bits into one transcode bit for each 66 bit code word. A group of 32 of the 65 bit code words form a 2080 bit data word, for example. FEC encoder 124 may generate (or determine) a CRC (cyclic redundancy check) over the 2080 bit data word using a fire code (or shortened fire code). The 32 bit CRC may be appended to the 2080 bit data word to provide a 2112 bit data block (or FEC block), according to an example embodiment. Other size blocks, and other types of FEC encoding may be performed.

Analog transmit block 126 may then transmit the bits, e.g., as symbols, via a communications media, such as a wireless channel, copper, optical, or other media. An antenna (not shown) may be coupled to the analog transmit block 126, e.g., for transmission over a wireless media, for a wireless embodiment.

Receiver 130 may receive the transmitted signal via an antenna (not shown). The analog receive DSP (digital signal processor) block 132 may process the received signals, e.g., converting received symbols into a bit stream.

FEC decoder 134 may perform FEC decoding on the received bit stream, e.g., based on 2112 bit data blocks. FEC decoder 134 may receive a data block (e.g., 2080 bit data word and 32 bit CRC), and may identify and correct errors if it can. FEC decoder 134 may pass on or output valid data, or if FEC decoder cannot correct an error in a block, it may provide an indication or flag to indicate a bad (or erroneous/uncorrectable) block, so this block may be dropped within the receiver 130. The receive PCS (physical coding sublayer) 136 may then convert the data blocks into MAC packets. These MAC packets may then be processed by higher layers at the network node. For example, upper layers may request retransmission for erroneous blocks or packets.

Figure 2:
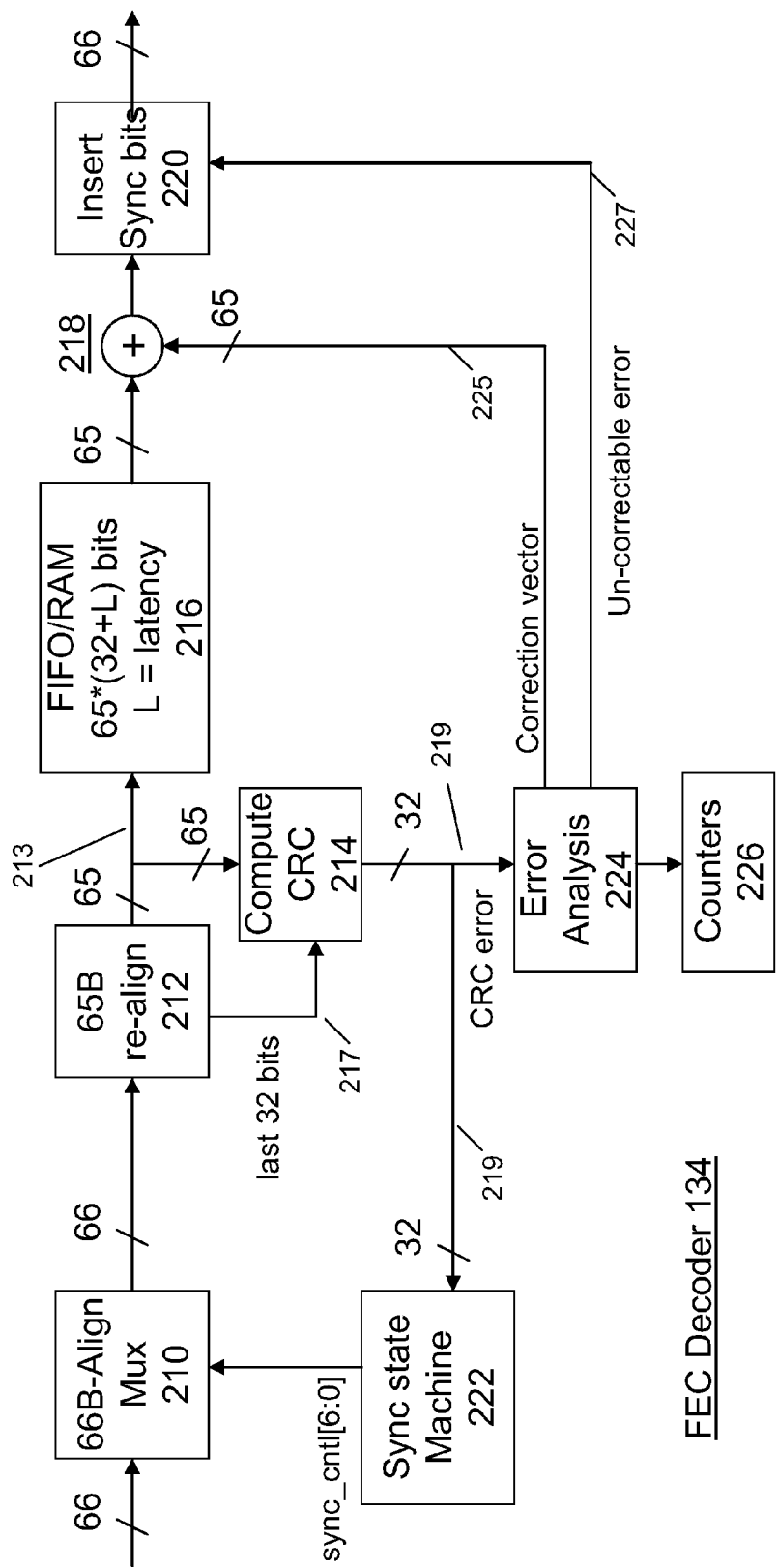
FIG. 2 is a block diagram illustrating a FEC decoder according to an example embodiment.

FIG. 2 is a block diagram illustrating a FEC decoder 134 according to an example embodiment. The received 2112 data block may be received in 32 66 bit words. The 66B-align mux may determine boundaries for the 2112 bit data block. The sync state machine 222 may receive a CRC error signal via line 219 (indicating whether the received CRC is correct or erroneous). The 66B-align mux 210 may determine the boundaries for each of the 2112 bit based on receipt of a correct CRC (based on the received CRC error signal).

65B realign 212 may realign the 2112 bit data word, and may extract and output the received 32 bit CRC for the 2112 bit data block via line 217 to compute CRC block 214. The remaining 2080 data bits are then output via line 213 to compute CRC block 214 where the CRC is recalculated based on the 2080 data bits. Compute CRC 214 then compares the calculated CRC to the received CRC, e.g., using an XOR (Exclusive OR) operation between these two CRCs, and outputs a CRC error signal via line 219. The CRC error signal may, for example, have 1s for any bits that did not match between the received CRC and the calculated CRC.

An error analysis block 224 may receive the CRC error signal via line 219. Error analysis block 224 may generate or determine a correction vector, if there is an error in the received data block. The correction vector may be applied to the data block to correct an error or burst error in the data block. In an example embodiment, the data bits (e.g., 2080 data bits for the data block) may be input to a FIFO/RAM 216, and then output to an XOR circuit 218, where the correction vector may be applied via line 225 and XORed with the data block to correct a burst error in the data block. Insert synch bits block 220 may typically then insert the synch (or synchronization) bits for each 65 bit data word, e.g., by replacing the transcode bit for each block with two synch bits.

In some cases, the error in the data block may be uncorrectable. The error analysis block 224 (or other block) may determine that the error is uncorrectable, e.g., based on the CRC error signal. In such case, error analysis block 224 may indicate, via uncorrectable error signal provided on line 227, that the current block has an uncorrectable error. Insert synch bits block 220 may then flag (or identify) that the current block has an uncorrectable error by inserting invalid synch bits. Upper layers may typically detect the invalid synch bits, and may drop the block, and/or request retransmission of the data block, for example. Counter 226 may count or maintain statistics on how many errors have been detected, the number that are correctable, the number (or percentage) that are uncorrectable, etc.

Figure 3:
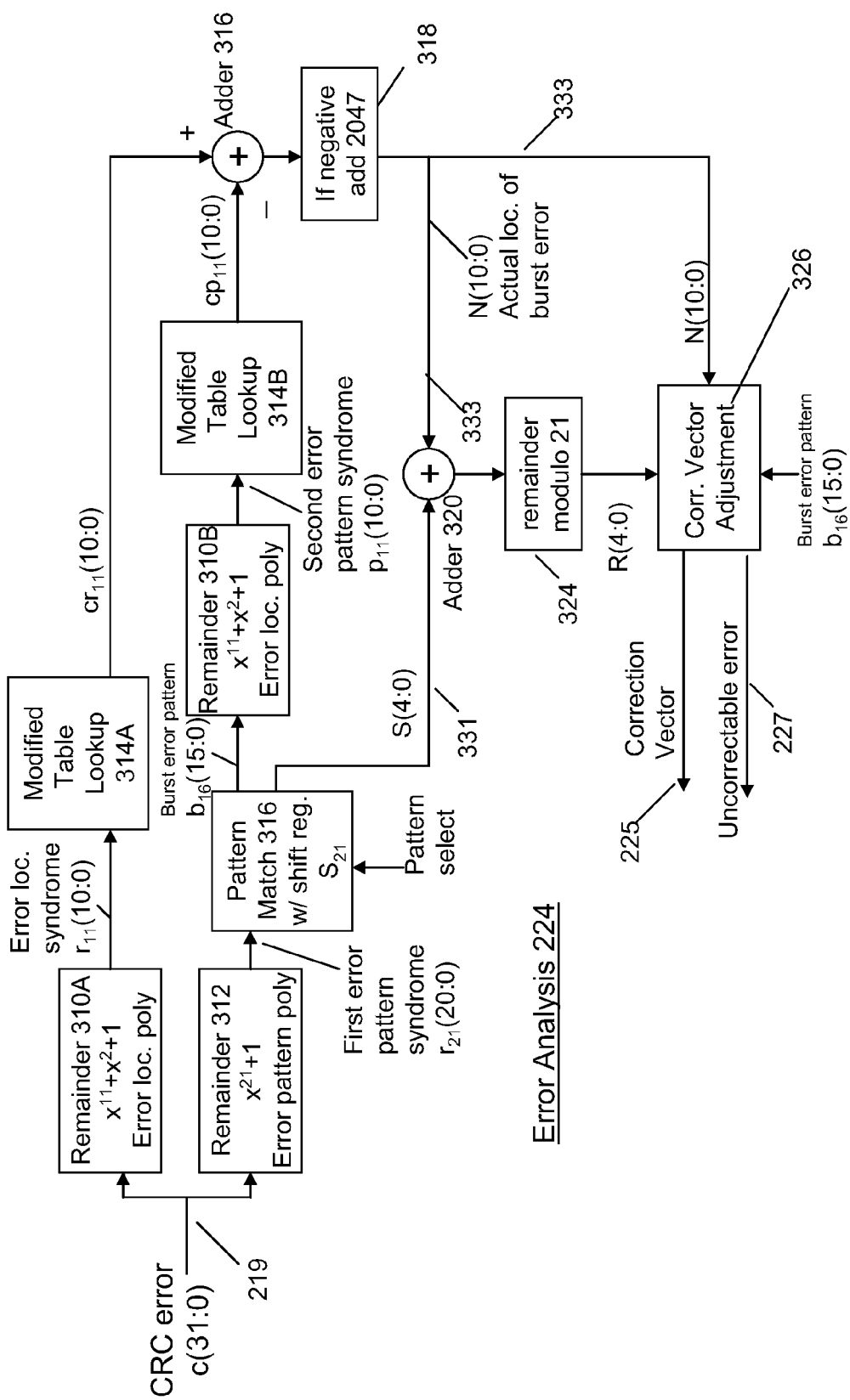
FIG. 3 is a block diagram of an error analysis block according to an example embodiment.

FIG. 3 is a block diagram of an error analysis block according to an example embodiment. Further details of error analysis block 224 (FIG. 2) are shown in FIG. 3, according to an example embodiment. According to an example embodiment, a Fire code may be used to calculate a CRC for the data block, as described above. The same Fire code may also be used to determine an error location polynomial and an error pattern polynomial. For example, the product of the error location polynomial and the error pattern polynomial may be the Fire code. An error location polynomial may be used, such as $x^{11}+x^2+1$ (e.g., error location polynomial having an order of 11). An error pattern polynomial may be used, such as $x^{21}+1$ (e.g., error pattern polynomial having an order of 21).

Referring to FIG. 3, an upper path through blocks 310A and 314A will be briefly described. The CRC error signal is received as an input signal into remainder block 310A via line 219. The CRC error signal may reflect or indicate a burst error in the data block, for example. A burst error may be, for example, a multi-bit error within a range of bits in the data block. Remainder block 310A may divide the CRC error by the error location polynomial, and output the remainder as an error location syndrome $r_{11}$ (10:0), which may be 11 bits, for example. The error location syndrome $r_{11}$ may be a syndrome of the burst error at its location (syndrome at the actual location of burst error) in the data block. The same burst error at different locations may typically result in a different remainder or different error location syndrome $r_{11}$.

The error location syndrome $r_{11}$ may be input or applied to a look-up table 314A, to output a first value $cr_{11}$ (10:0) corresponding to a relative location of the burst error in the data block with respect to a reference location. In this manner, the error location syndrome $r_{11}$ may be mapped to a first value $cr_{11}$ corresponding to a relative location of the burst error in the data block with respect to a reference location. This relative location of the burst error may identify the location of the first bit of the burst error relative to a reference location, for example.

With an 11 bit value being input to lookup table 314A, lookup table 314A may have (up to) $2^{11}$, or 2048 entries. In an example embodiment, each different value of the error location syndrome $r_{11}$ may correspond or identify (or map to) a different value $cr_{11}$ corresponding to a different relative location (or actual location) of the burst error in the data block. However, although not required, according to an example embodiment, a modified lookup table may be used that may use fewer table entries, such as a lookup table that uses only 1024 entries, e.g., based on the following process (as an example).:

Shift $r_{11}$ to the right until the LSB (least significant bit)=1, to get $sr_{11}$, with $sr_{11}(0)=1$; sr is the number of shifts and can be from 0 to 10, for an 11 bit number use $sr_{11}(10:1)$ as an index into 1024 entry table (modified lookup table 314A), to get $scr_{11}$ (range 0 to 2045); and add sr to $scr_{11}$ to get $cr_{11}$ (range 0 to 2046). This is merely an example embodiment.

Referring to FIG. 3 again, a lower path through blocks 312, 316, 310B and 314B will now be described briefly. At remainder block 312, the CRC error signal, received via line 219, may be divided by error pattern polynomial, and the remainder may be output as a first error pattern syndrome $r_{21}(20:0)$, which may be a 21 bit value, for example.

A pattern match block 316 may receive the first error pattern syndrome $r_{21}$ as an input. Pattern match 316 may evaluate the 21 bit syndrome to select a burst error pattern $b_{16}(15:0)$ within the first error pattern syndrome $r_{21}$ that matches one of two (or more) classes of correctable errors. Pattern match 316 may, for example, evaluate the different shifted locations of the first error pattern syndrome $r_{21}$ in parallel, by adjusting (e.g., shifting or rotating) the first error pattern syndrome $r_{21}$ to find a burst error pattern that matches one of the two correctable classes of errors. The pattern select input may, for example, identify the correctable burst error patterns to be searched and selected by pattern match block 316.

The amount (or number of times) that the first error pattern syndrome $r_{21}$ is adjusted (e.g., number of bit shifts or bit rotations) to select the burst error pattern $b_{16}$ may be referred to as an adjustment amount (S). Thus, the adjustment amount may be the number of bit rotations or shifts to find or select the burst error pattern $b_{16}$ (in the first error pattern syndrome $r_{21}$) that matches one of the two classes of correctable errors. This adjustment amount that the error pattern syndrome $r_{21}$ is adjusted to select the burst error pattern $b_{16}$ is output by pattern match block 316 as adjustment amount S(4:0) via line 331.

In an example embodiment, the two (or more) classes of correctable errors may include (as an example):

1) a burst error of length that is less than or equal to an order of the error location polynomial. In this example embodiment, with order of the error location polynomial being 11, this first class of correctable errors may include burst errors of 11 bits or less.

2) A burst error of length that is less than or equal to M bits (where M is greater than the order of the error location polynomial), and having no more than Y consecutive zeros within the burst error. For example, this second class of correctable errors may include burst errors of less than or equal to 16 bits, with no more than 4 consecutive zeros within the burst error.

While only two classes of correctable errors are described, other types of classes or types of errors may be defined and may be used by pattern match 316 to match the first error pattern syndrome $r_{21}$ to a correctable burst error pattern. The burst error pattern $b_{16}$ indicates the burst error that error analysis block 224 will be correcting within the data block, but burst error pattern $b_{16}$ may not typically identify the location of the burst error within the data block.

The burst error pattern $b_{16}$ is input to remainder block 310B, where the burst error pattern $b_{16}$ is divided by the error location polynomial, and the remainder is output as a second error pattern syndrome $p_{11}(10:0)$. The second error pattern syndrome $p_{11}$ may be a remainder or syndrome of the burst error at a reference location, e.g., at location zero or bit zero, for example.

In an example embodiment, the use of both the remainder block 312 (with error pattern polynomial) and the remainder block 310B (with error location polynomial) in the lower path may allow for the detection and correction of burst errors larger than the order of the error location polynomials. Thus, in this example, the use of both error pattern polynomial and error location polynomial in the lower path may allow for correction of burst errors longer than 11 bits. For example, this may allow for the correction of the second class of correctable burst errors, such as burst errors less than or equal to 16 bits, and with no more than 4 consecutive zeros within the burst error.

The error pattern syndrome $p_{11}$ may be input or applied to a look-up table 314B (which may be the same as look-up table 314A), to output a second value $cp_{11}(10:0)$ corresponding to the reference location in the data block. The reference location within the data block may be bit zero, for example, or other reference location.

At adder 316, the second value $cp_{11}$ (corresponding to the reference location) is subtracted from the first value $cr_{11}$ (corresponding to a relative location of the burst error in the data block with respect to the reference location), to output onto line 333 the actual location N(10:0) of the burst error in the data block. If the actual location value that is output by adder 316 is negative, then block 318 may add 2047 to this value to provide the actual location N.

In an example embodiment, a correction vector adjustment block 326 may receive several inputs, including the burst error pattern $b_{16}$, and the actual location N(10:0) of the burst error. The correction vector adjustment block 326 may generate a correction vector based on the burst error pattern $b_{16}$ and the actual location N of the burst error. For example, the correction vector may be determined or provided by shifting the burst error pattern $b_{16}$ an amount based on the actual location N of the burst error. In an example embodiment, the burst error pattern $b_{16}$ may be shifted a number of bits equal to the actual location N (or location of first bit in burst error). This will allow the correction vector to properly align with the burst error in the data block when the correction vector is applied to the data block.

The correction vector may be output by correction vector adjustment block 326 onto line 225, and may be applied to the data block to correct the burst error in the data block. For example, as shown in FIG. 2, the correction vector may be XORed (Exclusive OR operation) with the data block by XOR circuit 218. The 1s in the correction vector (indicating bad or incorrect bits to be corrected) will cause the corresponding bits in the data block to flip or change state (from 1 or 0, or 0 to 1), thereby correcting these bits in the data block, for example, based on the operation of XOR circuit 218.

The actual location N(10:0) of the burst error output by adder 316 may be, in this example, an 11-bit value (N having values between 0 and 2046). Thus, the value of N may go up to only 2046. However, according to an example embodiment, the error analysis block 224 may be able to detect and correct burst errors within data blocks longer than 2047 bits (N may have values between 0 and 2046). However, the actual location N of the burst error is provided modulo 2047. Thus, if the location of the burst error is at bit 2047, N may show up as a 0, which would be incorrect, unless there was also an indication that the location (N) of the burst error was outside the range of N.

Thus, according to an example embodiment, the data block may be considered to include multiple sub-blocks. In this example, the 2112 bit data block may include two sub-blocks including a first sub-block of 2047 bits, and a second sub-block with the remaining bits 2048-2112, for example. Other data blocks may include more sub-blocks, or any number of sub-blocks, e.g., 3, 4, 5, . . . Also, sub-blocks of a different size(s) may be used. According to an example embodiment, the error analysis block 224 may determine or identify the sub-block in which the burst error is located (e.g., location within the data block of first bit in the burst error). Then, the correction vector may be shifted by an offset amount based on which sub-block the burst error is located in the data block, so that the correction vector will be properly aligned with the data block when it is applied via XOR circuit 218 to correct the burst error.

An example embodiment will now be described where the sub-block where the burst error is located (or begins) is identified and the correction vector is then shifted by an offset amount based on the sub-block where the burst error is located.

Referring to FIG. 3 again, an adder circuit 320 may add the adjustment amount S(4:0) and the actual location N(10:0) to generate a sum (N+S). The sum (N+S) is then divided by 21 (e.g., which may be the order of the error pattern polynomial) to generate a remainder R(4:0). Thus, a remainder may be determined of the sum (N+S) modulo Z, where Z may be the order of the error pattern polynomial (e.g., 21 in the example illustrated). The remainder R may be used as a unique identifier for the sub-block in which the burst error pattern is found. The remainder R may be calculated using a division process (divide by 21). In another example embodiment, rather than performing the division process to determine the remainder R, a more efficient technique may be used to determine the remainder R of (N+S/21), which is described in greater detail below.

There may be several cases, based on the value of the remainder R: For example:
a) if R=0, error is correctable, first bit of burst error is at location N, within the first sub-block (first 2047 bits); offset amount=0
b) if R=11 (decimal eleven), and N<65, error is correctable, first bit of burst error is at location N in the second sub-block (between bits 2048 and 2112); offset amount=2047 bits; (thus, within the data block, the first bit of burst error is at bit 2047+N);
c) else, error is not correctable.

Every sub-block may be associated with a unique value of R. For example, R=0 identifies or is associated with a first sub-block; R=11 (decimal eleven) identifies or is associated with a second sub-block, etc. There are other values of R that identify (or are associated with) other sub-blocks.

In the case c) above (else case), one possibility is that a value of R is obtained that identifies an invalid sub-block (identifies a sub-block where the burst error is located that is not a valid sub-block, or that is outside the data block). For example, in the case of a data block with two sub-blocks, if R identifies a third or fourth sub-block, then this indicates that the error is not correctable. Also, if R identifies a last valid sub-block (e.g., second sub-block), and N is greater than the size of the second sub-block (e.g., N>65 in our example), this may also identify an uncorrectable error.

There are some other situations that may indicate that a detected burst error is not correctable. In such case, the uncorrectable error may be flagged to upper layers at the receiving node by, e.g., block 220 inserting invalid synch bits. Thus, at various points, a test may be performed to determine whether or not a burst error is correctable. For example, with reference to FIG. 3:
a) if both $r_{21}$ (first error pattern syndrome) and $r_{11}$ (error location syndrome) are zero, then no errors in the data block
b) if only one of $r_{21}$ and $r_{11}$ are zero, then errors are present but are not correctable
c) if $p_{11}$ (second error pattern syndrome) is zero, then errors are not correctable. The, the operation of a receiver or network node may include determining a correctability of the burst error based on a value of the second error pattern syndrome, wherein a value of zero for the second error pattern syndrome indicates that the burst error is not correctable. Other situations may exist as well that may indicate that the errors (burst errors) may not be correctable.

In an example embodiment, the remainder R calculated in block 324 of FIG. 3 (which calculates remainder R of N+S, modulo 21) may be calculated in a more efficient technique. For example, remainder R may be calculated based on the following:

Remainder R(4:0)=(N+S) rem (21), based on performing the following:
1) N(4:0)+N(10:6)+N(5)*11=X(6:0) (0 to 73)
2) X(4:0)+X(5)*11+X(6)=Y(5:0) (0 to 43)
3) Z(5:0)=Y(5:0)+S(4:0) (0 to 63)
4) If Z(5:0)<21, then R(4:0)=Z(4:0)
5) If 21<Z(5:0)<42, then R(4:0)=Z(5:0)−21
6) If 42<Z(5:0)<63, then R(4:0)=Z(5:0)−42
7) Else R(4:0)=0 (e.g., in the case where Z is 21 or 42, there is no remainder)

In general, the remainder may be calculated by splitting N into multiple pieces, calculate the remainder modulo 21 for each piece (e.g., 21 is the order of the error pattern polynomial) to calculate a partial remainder for each piece, and adding these partial remainders together to calculate remainder of N modulo 21. This remainder of N is then added to S, to generate a partial sum. The remainder may be calculated by subtracting 21, or a largest multiple of 21, from this partial sum.

For example, in operation 1), a five bit X(5:0) is calculated by splitting N into multiple pieces, and adding these pieces together. For example, the first five bits of N, shown as N(4:0), are added to bits 6-10 of N; bit 5 of N is multiplied by eleven (decimal 11), and then added to the other pieces of N.

In operation 2), a 6 bit Y(5:0) is calculated in the same manner, by breaking X into pieces.

In operation 3), Z is calculated as N+S.

Operations 4-7 indicate what the remainder R will be, based on Z. If Z is less than 21, then R is equal to Z. If Z is greater than 21, then R is calculated by subtracting a multiple of 21 (21, 42, etc.), until a remainder of less than 21 is determined. Operation 7) is a case where Z is exactly 21 or 42, and thus remainder R would be zero.

Figure 4:
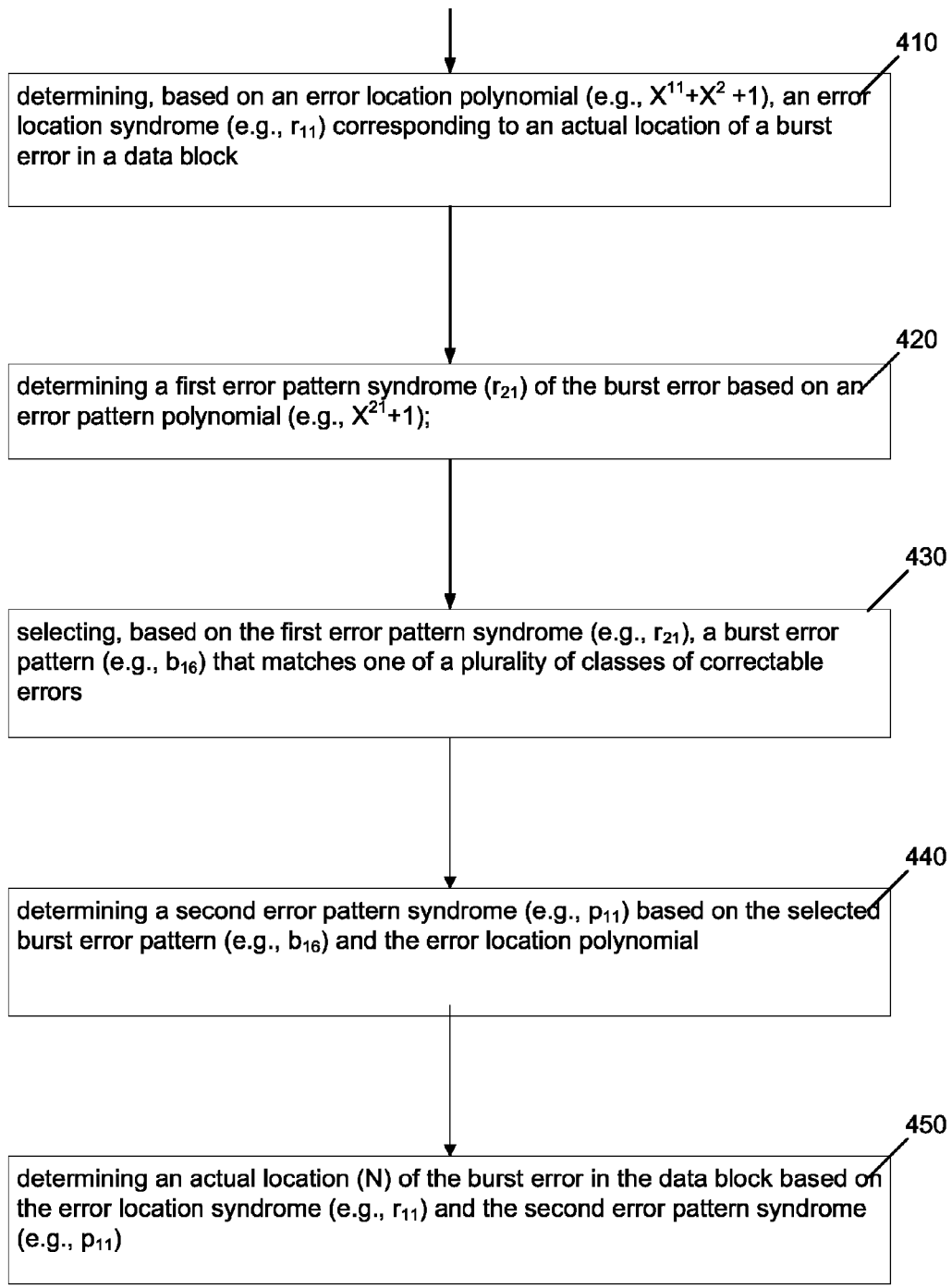
FIG. 4 is a flow chart illustrating operation of a node or device according to an example embodiment.

FIG. 4 is a flow chart illustrating operation of a node according to an example embodiment. Operation 410 may include determining, based on an error location polynomial (e.g., $X^{11}+X^2+1$), an error location syndrome (e.g., $r_{11}$) corresponding to an actual location of a burst error in a data block; Operation 420 may include determining a first error pattern syndrome (e.g., $r_{21}$) of the burst error based on an error pattern polynomial (e.g., $X^{21}+1$); Operation 430 may include selecting, based on the first error pattern syndrome (e.g., $r_{21}$), a burst error pattern (e.g., $b_{16}$) that matches one of a plurality of classes of correctable errors; Operation 440 may include determining a second error pattern syndrome (e.g., $p_{11}$) based on the selected burst error pattern (e.g., $b_{16}$) and the error location polynomial; Operation 450 may include determining an actual location (e.g., N) of the burst error in the data block based on the error location syndrome (e.g., $r_{11}$) and the second error pattern syndrome (e.g., $p_{11}$).

In an example embodiment, operation 410 may include dividing a CRC error c(31:0) for the data block by the error location polynomial to obtain a remainder as the error location syndrome ($r_{11}$).

In an example embodiment, operation 430 may include rotating the first error pattern syndrome (e.g., $r_{21}$) until a correctable burst error pattern (e.g., $b_{16}$) is found that matches one of two classes of correctable errors, including:
1) a burst error of length that is less than or equal to an order of the error location polynomial; or
2) a burst error of length that is less than or equal to M bits, and having no more than Y consecutive zeros within the burst error, where M is greater than the order of the error location polynomial.

In an example embodiment, operation 430 may include rotating the first error pattern syndrome (e.g., $r_{21}$) until a correctable burst error pattern (e.g., $b_{16}$) is found that matches one of two classes of correctable errors, including:
1) a burst error of length that is less than or equal to 11 bits, where 11 is the order of the error location polynomial; or
2) a burst error of length that is less than or equal to 16 bits, and having no more than 4 consecutive zeros within the burst error.

In an example embodiment, operation 450 may include mapping the error location syndrome (e.g., $r_{11}$) to a first value (e.g., $cr_{11}$) corresponding to a relative location of the burst error in the data block with respect to a reference location; mapping the second error pattern syndrome (e.g., $p_{11}$) to a second value (e.g., $cp_{11}$) corresponding to the reference location; and determining the actual location (e.g., N) of the burst error in the data block by subtracting the first and second values.

The method of FIG. 4 may also include correcting the burst error, including: shifting the selected burst error pattern (e.g., $b_{16}$) an amount based on the actual location (N) of the burst error to obtain a correction vector; and XORing the correction vector with the data block to correct the burst error in the data block.

According to another example embodiment, an apparatus may include logic (such as that shown in any of FIGS. 1-3). The apparatus may be configured to: determine, based on an error location polynomial (e.g., $X^{11}+X^2+1$), an error location syndrome (e.g., $r_{11}$) corresponding to an actual location of a burst error in a data block; select a burst error pattern (e.g., $b_{16}$) that matches one of a plurality of classes of correctable errors; determine an error pattern syndrome (e.g., $p_{11}$) based on the selected burst error pattern ($b_{16}$) and the error location polynomial; and determine an actual location (N) of the burst error in the data block based on the error location syndrome (e.g., $r_{11}$) and the error pattern syndrome (e.g., $p_{11}$).

Figure 5:
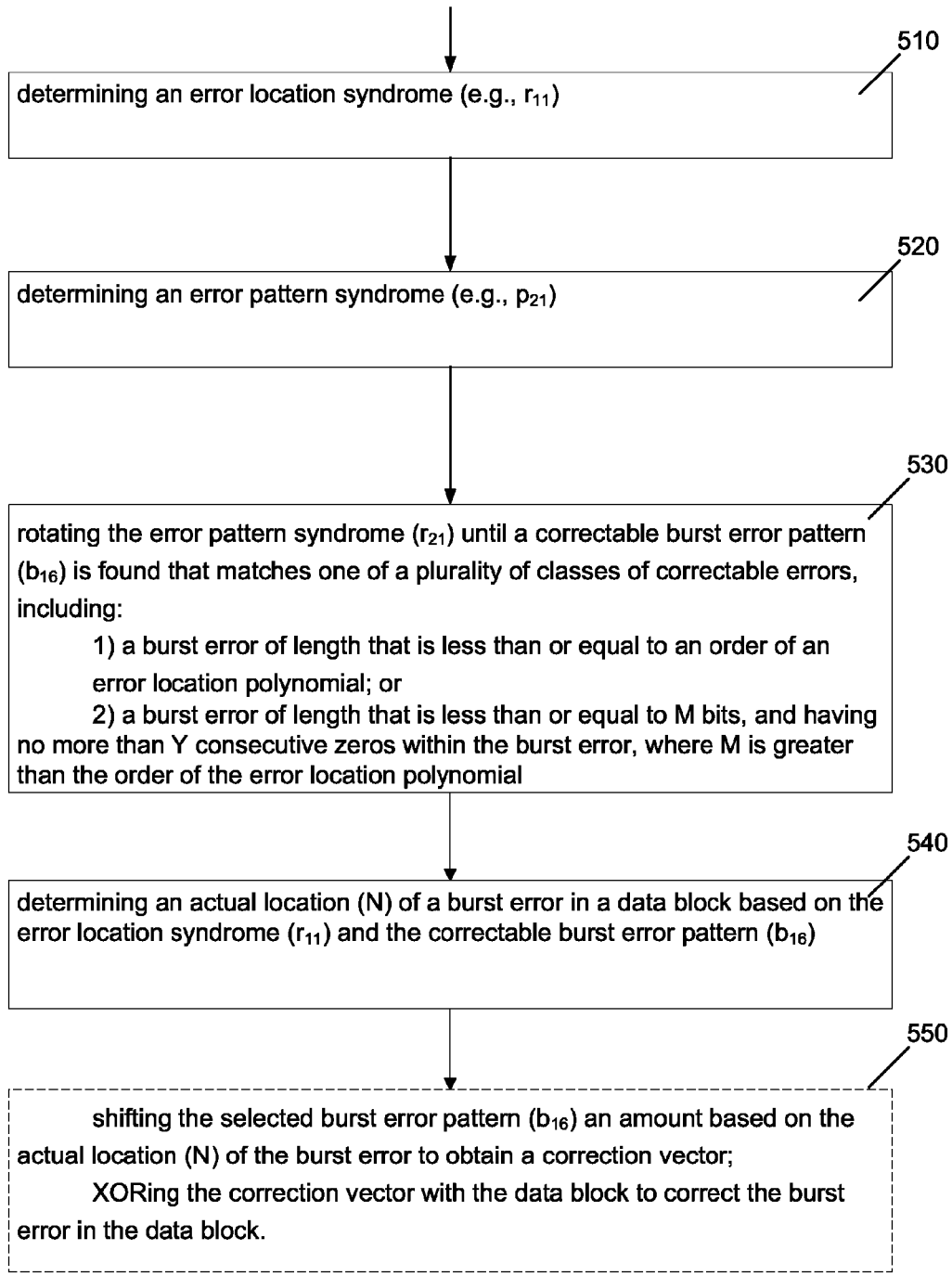
FIG. 5 is a flow chart illustrating operation of a node or device according to another example embodiment.

FIG. 5 is a flow chart illustrating operation of a node according to another example embodiment. Operation 510 may include determining an error location syndrome (e.g., $r_{11}$). Operation 520 may include determining an error pattern syndrome (e.g., $p_{21}$). Operation 530 may include rotating the error pattern syndrome (e.g., $r_{21}$) until a correctable burst error pattern ($b_{16}$) is found that matches one of a plurality of classes of correctable errors, including: 1) a burst error of length that is less than or equal to an order of an error location polynomial; or 2) a burst error of length that is less than or equal to M bits, and having no more than Y consecutive zeros within the burst error, where M is greater than the order of the error location polynomial. Operation 540 may include determining an actual location (N) of a burst error in a data block based on the error location syndrome ($r_{11}$) and the correctable burst error pattern ($b_{16}$).

In an example embodiment, the flow chart of FIG. 5 may also include operation 550, which may include shifting the selected burst error pattern an amount based on the actual location of the burst error to obtain a correction vector; and XORing (Exclusive OR) the correction vector with the data block to correct the burst error in the data block.

Figure 6:
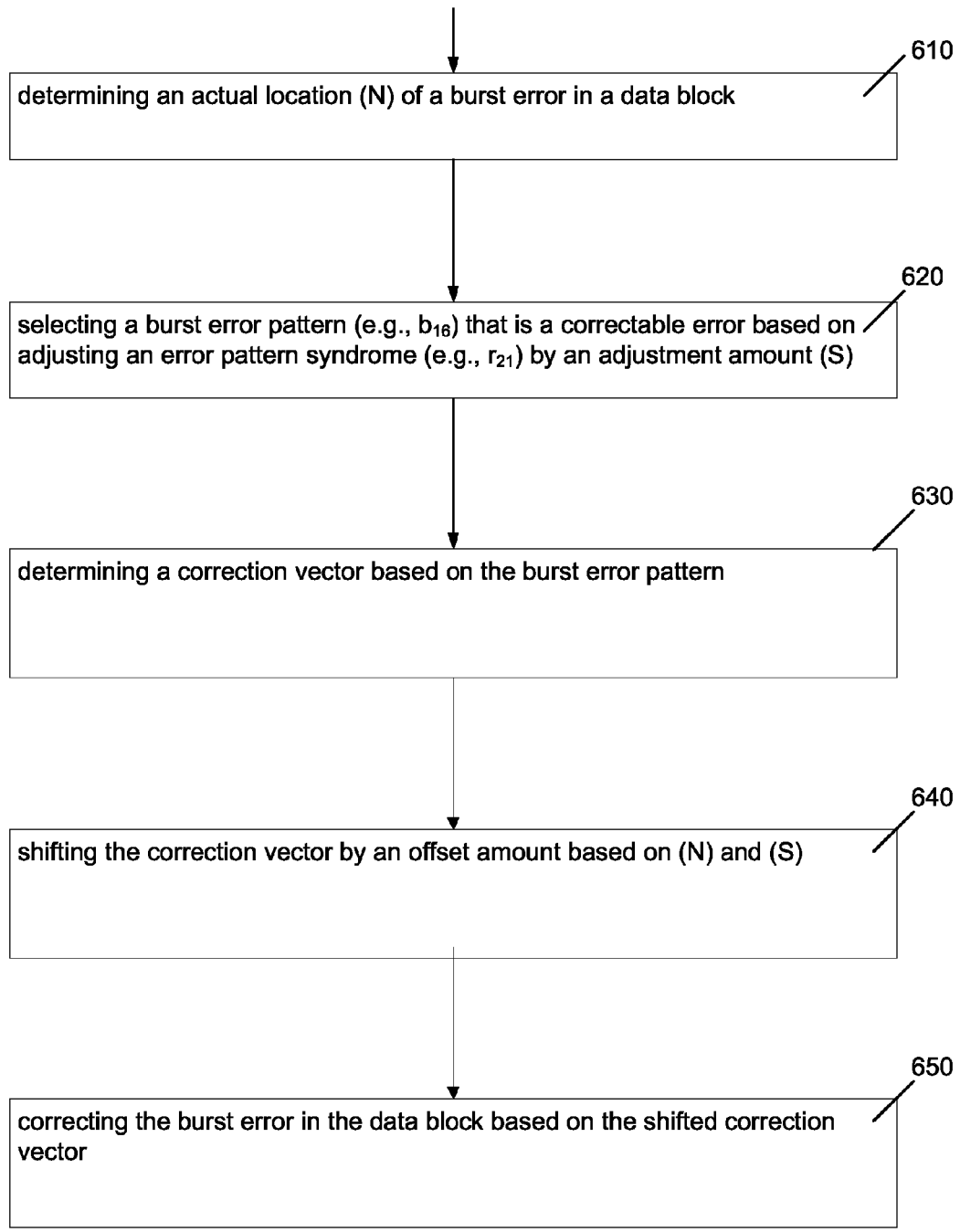
FIG. 6 is a flow chart illustrating operation of a node or device according to another example embodiment.

FIG. 6 is a flow chart illustrating operation of a node according to another example embodiment. Operation 610 may include determining an actual location (e.g., N) of a burst error in a data block. Operation 620 may include selecting a burst error pattern (e.g., $b_{16}$) that is a correctable error based on adjusting an error pattern syndrome (e.g., $r_{21}$) by an adjustment amount (e.g., S). Operation 630 may include determining a correction vector based on the burst error pattern. Operation 640 may include shifting the correction vector by an offset amount based on (N) and (S). and, operation 650 may include correcting the burst error in the data block based on the shifted correction vector.

In an example embodiment, operation 630 may include shifting the selected burst error pattern based on the actual location (N) of the burst error in the data block, the correction vector including the shifted burst error pattern.

In another example embodiment, operation 630 may include shifting or rotating the selected burst error pattern (N) bits to obtain the correction vector.

In another example embodiment, operation 620 may include selecting, based on rotating or shifting an error pattern syndrome ($r_{21}$) (S) number of times, a burst error pattern ($b_{16}$) that is a correctable error.

In another example embodiment, operation 620 may include selecting, based on rotating or shifting an error pattern syndrome ($r_{21}$) (S) number of bits, a burst error pattern ($b_{16}$) that matches one of a plurality of classes of correctable errors.

In another example embodiment, operation 640 may include determining which sub-block the burst error is located based on (N) and (S); and shifting the correction vector by an offset amount based on the sub-block where the burst error is located.

In another example embodiment, operation 640 may include adding the number (N) indicating an actual location of the burst error to the adjustment amount (S) that the error pattern syndrome is adjusted to select the burst error pattern, to produce the sum (N+S); determining a remainder of the sum (N+S) modulo Z, where Z is the order of an error pattern polynomial that is used to generate the error pattern syndrome; selecting an offset amount based on the remainder; and shifting the correction vector by the selected offset amount.

For example, the remainder may be determined by: determining a remainder of the sum (N+S) modulo Z, where Z is the order of an error pattern polynomial that is used to generate the error pattern syndrome, wherein a value of the remainder indicates which sub-block of a data block the burst error is located, and wherein the correction vector is shifted by a different offset amount depending on the sub-block where the burst error is located or begins.

Figure 7:
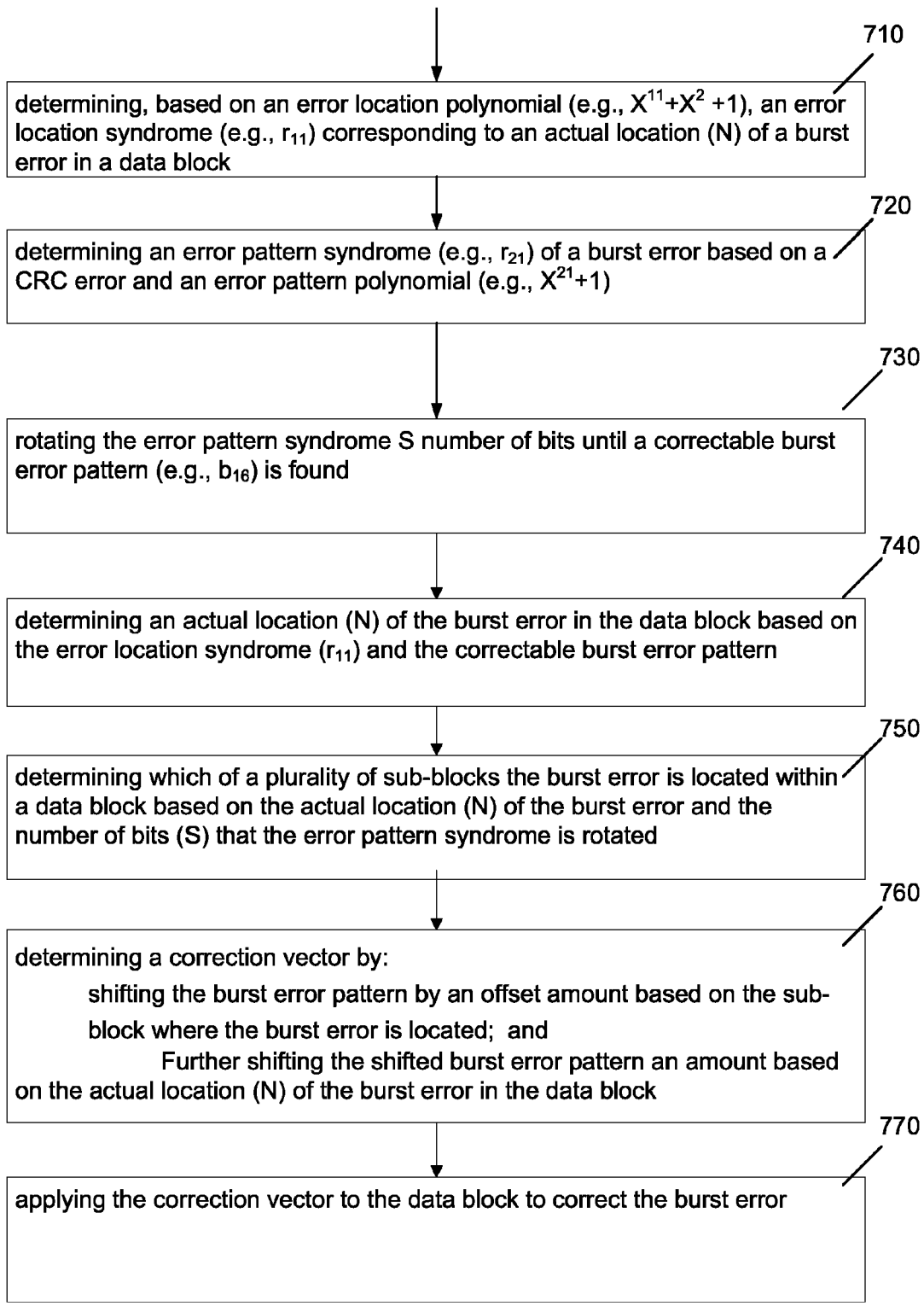
FIG. 7 is a flow chart illustrating operation of a node or device according to another example embodiment.

FIG. 7 is a flow chart illustrating operation of a node according to another example embodiment. Operation 710 may include determining, based on an error location polynomial (e.g., $X^{11}+X^2+1$), an error location syndrome (e.g., $r_{11}$) corresponding to an actual location (e.g., N) of a burst error in a data block. Operation 720 may include determining an error pattern syndrome (e.g., $r_{21}$) of a burst error based on a CRC error and an error pattern polynomial (e.g., $X^{21}+1$). Operation 730 may include rotating the error pattern syndrome S number of bits until a correctable burst error pattern (e.g., $b_{16}$) is found. Operation 740 may include determining an actual location (e.g., N) of the burst error in the data block based on the error location syndrome (e.g., $r_{11}$) and the correctable burst error pattern. Operation 750 may include determining which of a plurality of sub-blocks the burst error is located within a data block based on the actual location (N) of the burst error and the number of bits (S) that the error pattern syndrome is rotated. Operation 760 may include determining a correction vector by: shifting the burst error pattern by an offset amount based on the sub-block where the burst error is located; and, further shifting the shifted burst error pattern an amount based on the actual location (N) of the burst error in the data block. And, operation 770 may include applying the correction vector to the data block to correct the burst error.

Figure 8:
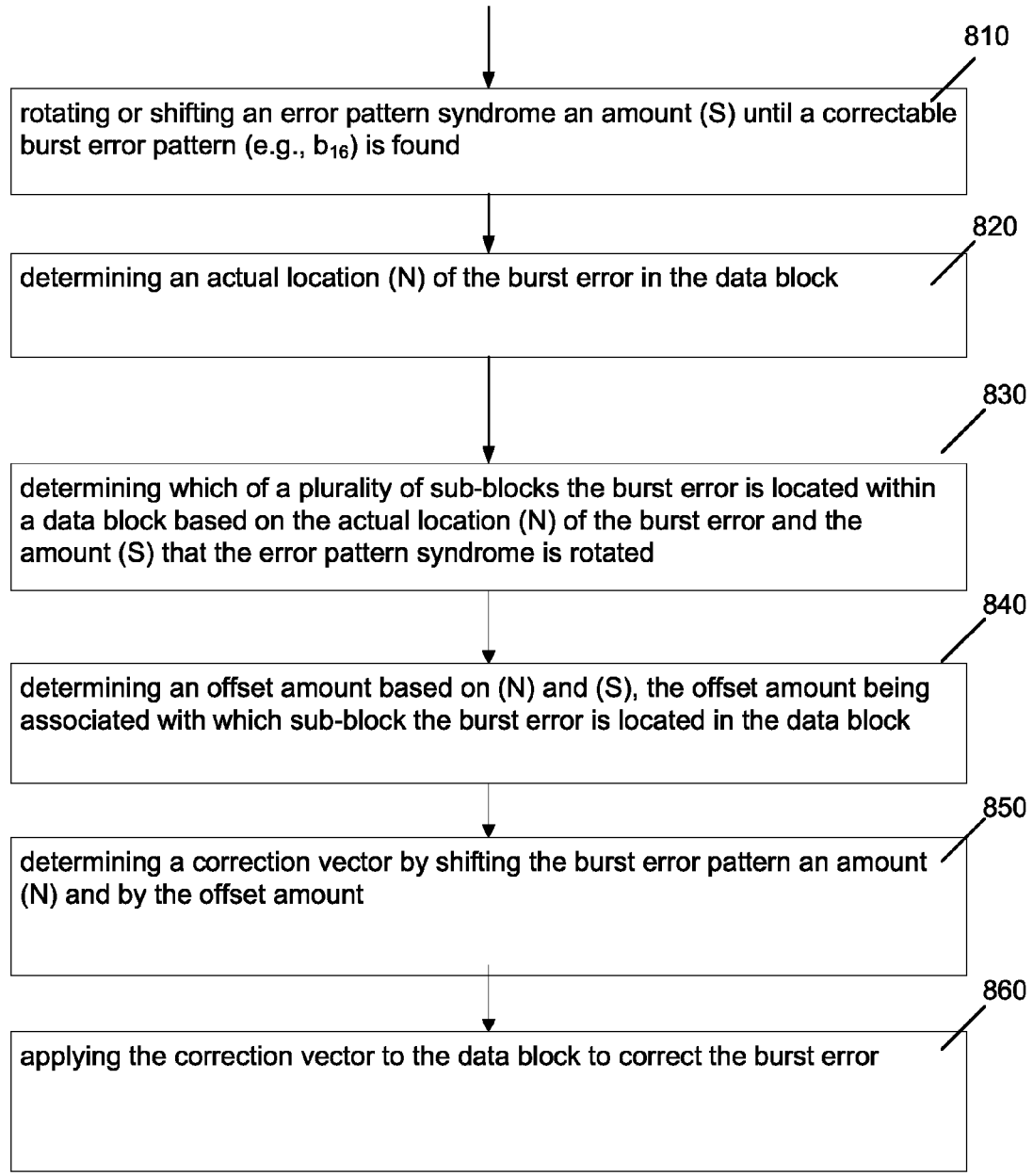
FIG. 8 is a flow chart illustrating operation of a node or device according to yet another example embodiment.

FIG. 8 is a flow chart illustrating operation of a node according to yet another example embodiment. Operation 810 may include rotating or shifting an error pattern syndrome an amount (e.g., S) until a correctable burst error pattern (e.g., $b_{16}$) is found. Operation 820 may include determining an actual location (e.g., N) of the burst error in the data block. Operation 830 may include determining which of a plurality of sub-blocks the burst error is located within a data block based on the actual location (e.g., N) of the burst error and the amount (e.g., S) that the error pattern syndrome is rotated. Operation 840 may include determining an offset amount based on (N) and (S), the offset amount being associated with which sub-block the burst error is located in the data block. Operation 850 may include determining a correction vector by shifting the burst error pattern an amount (N) and by the offset amount. Operation 860 may include applying the correction vector to the data block to correct the burst error.

Figure 9:
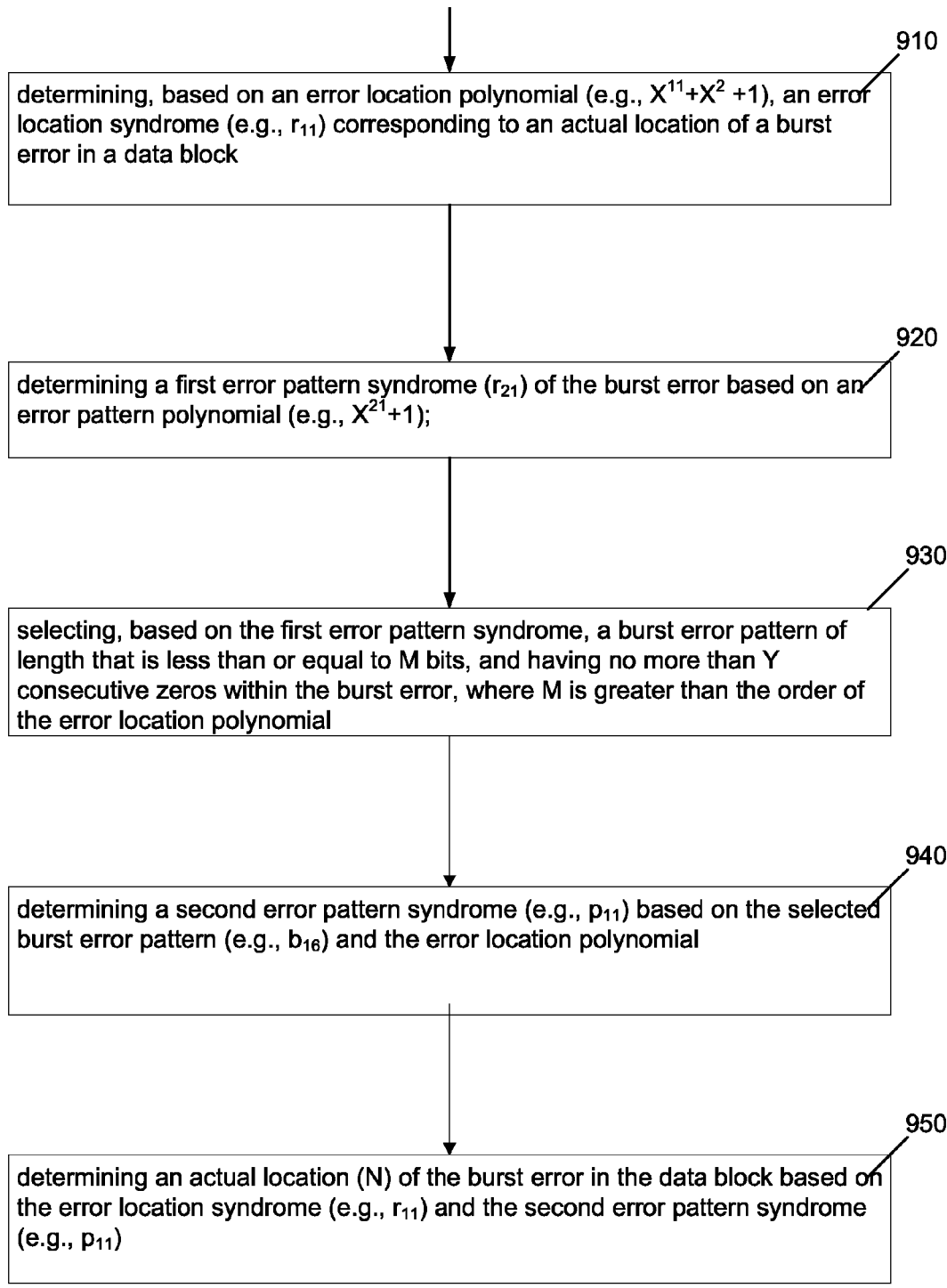
FIG. 9 is a flow chart illustrating operation of a node or device according to yet another example embodiment.

FIG. 9 is a flow chart illustrating operation of a node or device according to yet another example embodiment. Operation 910 may include determining, based on an error location polynomial (e.g., $X^{11}+X^2+1$), an error location syndrome (e.g., $r_{11}$) corresponding to an actual location of a burst error in a data block; Operation 920 may include determining a first error pattern syndrome (e.g., $r_{21}$) of the burst error based on an error pattern polynomial (e.g., $X^{21}+1$); Operation 930 may include selecting, based on the first error pattern syndrome (e.g., $r_{21}$), a burst error pattern (e.g., $b_{16}$) of length that is less than or equal to M bits, and having no more than Y consecutive zeros within the burst error, where M is greater than the order of the error location polynomial.

Operation 940 may include determining a second error pattern syndrome (e.g., $p_{11}$) based on the selected burst error pattern (e.g., $b_{16}$) and the error location polynomial; Operation 950 may include determining an actual location (e.g., N) of the burst error in the data block based on the error location syndrome (e.g., $r_{11}$) and the second error pattern syndrome (e.g., $p_{11}$).

In an example embodiment, operation 910 may include dividing a CRC error c(31:0) for the data block by the error location polynomial to obtain a remainder as the error location syndrome ($r_{11}$).

In an example embodiment, operation 930 may include rotating the first error pattern syndrome until a burst error pattern is found of length that is less than or equal to M bits, and having no more than Y consecutive zeros within the burst error, where M is greater than the order of the error location polynomial.

In an example embodiment, operation 930 may include rotating the first error pattern syndrome (e.g., $r_{21}$) until a burst error pattern (e.g., $b_{16}$) is found that is less than or equal to 16 bits, and having no more than 4 consecutive zeros within the burst error.

In an example embodiment, operation 950 may include mapping the error location syndrome (e.g., $r_{11}$) to a first value (e.g., $cr_{11}$) corresponding to a relative location of the burst error in the data block with respect to a reference location; mapping the second error pattern syndrome (e.g., $p_{11}$) to a second value (e.g., $cp_{11}$) corresponding to the reference location; and determining the actual location (e.g., N) of the burst error in the data block by subtracting the first and second values.

The method of FIG. 9 may also include correcting the burst error, including: shifting the selected burst error pattern (e.g., $b_{16}$) an amount based on the actual location (N) of the burst error to obtain a correction vector; and XORing the correction vector with the data block to correct the burst error in the data block.

According to another example embodiment, an apparatus may include logic (such as that shown in any of FIGS. 1-3). The apparatus may be configured to: determine, based on an error location polynomial (e.g., $X^{11}+X^2+1$), an error location syndrome (e.g., $r_{11}$) corresponding to an actual location of a burst error in a data block; select a burst error pattern that is less than or equal to M bits, and having no more than Y consecutive zeros within the burst error, where M is greater than the order of the error location polynomial; determine an error pattern syndrome (e.g., $p_{11}$) based on the selected burst error pattern ($b_{16}$) and the error location polynomial; and determine an actual location (N) of the burst error in the data block based on the error location syndrome (e.g., $r_{11}$) and the error pattern syndrome (e.g., $p_{11}$).

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus comprising logic, the apparatus configured to:
    determine, based on an error location polynomial, an error location syndrome corresponding to an actual location of a burst error in a data block;
    determine a first error pattern syndrome of the burst error based on an error pattern polynomial;
    select, based on the first error pattern syndrome, a burst error pattern of length that is less than or equal to M bits, and having no more than Y consecutive zeros within the burst error, where M is greater than the order of the error location polynomial, including being configured to rotate the first error pattern syndrome until a correctable burst error pattern is found;
    determine a second error pattern syndrome based on the selected burst error pattern and the error location polynomial; and determine an actual location of the burst error in the data block based on the error location syndrome and the second error pattern syndrome.

2. The apparatus of claim 1 wherein the apparatus being configured to determine an error location syndrome comprises the apparatus a CRC error for the data block by the error location polynomial to obtain a remainder as the error location syndrome.

3. The apparatus of claim 1 wherein the apparatus being configured to determine a first error pattern syndrome of the burst error comprises the apparatus being configured to divide a CRC error for the data block by the error pattern polynomial to obtain a remainder as the first error pattern syndrome.

4. The apparatus of claim 1 wherein the apparatus being configured to select comprises the apparatus being configured to rotate the first error pattern syndrome until a burst error pattern is found of length that is less than or equal to M bits, and having no more than Y consecutive zeros within the burst error, where M is greater than the order of the error location polynomial.

5. The apparatus of claim 1 wherein the apparatus being configured to select comprises the apparatus being configured to rotate the first error pattern syndrome until a correctable burst error pattern is found that is less than or equal to 16 bits, and having no more than 4 consecutive zeros within the burst error.

6. The apparatus of claim 1 wherein the apparatus being configured to determine an actual location of the burst error in the data block based on the error location syndrome and the second error pattern syndrome comprises the apparatus being configured to:
   map the error location syndrome to a first value corresponding to a relative location of the burst error in the data block with respect to a reference location;
   map the second error pattern syndrome to a second value corresponding to the reference location; and
   determine the actual location of the burst error in the data block by subtracting the first and second values.

7. The apparatus of claim 1 and further comprising the apparatus being configured to correct the burst error in the data block.

8. The apparatus of claim 1 and further comprising the apparatus being configured to correct the burst error, including the apparatus being configured to:
   shift the selected burst error pattern an amount based on the actual location of the burst error to obtain a correction vector; and
   XOR the correction vector with the data block to correct the burst error in the data block.

9. The apparatus of claim 1 and further comprising the apparatus being configured to determine a correctability of the burst error based on a value of the second error pattern syndrome.

10. The apparatus method of claim 1 and further comprising the apparatus being configured to determine a correctability of the burst error based on a value of the second error pattern syndrome, wherein a value of zero for the second error pattern syndrome indicates that the burst error is not correctable.

11. An apparatus comprising logic, the apparatus configured to:
   determine, based on an error location polynomial, an error location syndrome corresponding to an actual location of a burst error in a data block, including being configured to divide a CRC error for the data block by the error location polynomial to obtain a remainder as the error location syndrome;
   select a burst error pattern that is less than or equal to M bits, and having no more than Y consecutive zeros within the burst error, where M is greater than the order of the error location polynomial;
   determine an error pattern syndrome based on the selected burst error pattern and the error location polynomial; and
   determine an actual location of the burst error in the data block based on the error location syndrome and the error pattern syndrome.

12. The apparatus of claim 11 wherein the apparatus being configured to select comprises the apparatus being configured to rotate an error pattern syndrome until a correctable burst error pattern is found that matches one of a plurality of classes of correctable errors, including:
   1) a burst error of length that is less than or equal to an order of the error location polynomial; or
   2) a burst error of length that is less than or equal to M bits, and having no more than Y consecutive zeros within the burst error, where M is greater than the order of the error location polynomial.

13. The apparatus of claim 11 wherein the apparatus being configured to select comprises the apparatus being configured to rotate an error pattern syndrome until a correctable burst error pattern is found that is less than or equal to 16 bits, and having no more than 4 consecutive zeros within the burst error.

14. The apparatus of claim 11 wherein the apparatus comprises an FEC (Forward Error Correction) block.

15. The apparatus of claim 11 wherein the apparatus comprises a receiver configured to receive signals over a backplane.

16. An apparatus comprising logic, the apparatus being configured to:
   determine an error location syndrome;
   determine an error pattern syndrome;
   rotate the error pattern syndrome until a correctable burst error pattern is found that matches one of a plurality of classes of correctable errors, including:
   1) a burst error of length that is less than or equal to an order of an error location polynomial; or
   2) a burst error of length that is less than or equal to M bits, and having no more than Y consecutive zeros within the burst error, where M is greater than the order of the error location polynomial; and
   determine an actual location of a burst error in a data block based on the error location syndrome and the correctable burst error pattern.

17. The apparatus of claim 16 wherein the rotating comprises rotating an error pattern syndrome until a correctable burst error pattern is found that matches one of a plurality of classes of correctable errors, including:
   1) a burst error of length that is less than or equal to 11 bits, where 11 is the order of the error location polynomial; or
   2) a burst error of length that is less than or equal to 16 bits, and having no more than 4 consecutive zeros within the burst error.

18. The apparatus of claim 16 and further comprising correcting the burst error, including:
   shifting the selected burst error pattern an amount based on the actual location of the burst error to obtain a correction vector;
   XORing the correction vector with the data block to correct the burst error in the data block.

* * * * *

UNITED STATES PATENT AND TRADEMARK OFFICE
CERTIFICATE OF CORRECTION

PATENT NO. : 8,136,013 B2
APPLICATION NO. : 11/840442
DATED : March 13, 2012
INVENTOR(S) : Magesh Valliappan et al.

Page 1 of 1

It is certified that error appears in the above-identified patent and that said Letters Patent is hereby corrected as shown below:

In column 13, line 6, in claim 2, after "apparatus" insert -- being configured to divide --.

Signed and Sealed this
Twelfth Day of June, 2012

David J. Kappos
*Director of the United States Patent and Trademark Office*